(12) United States Patent
Kajimoto

(10) Patent No.: US 8,319,231 B2
(45) Date of Patent: Nov. 27, 2012

(54) DISPLAY DEVICE

(75) Inventor: Norifumi Kajimoto, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 13/149,571

(22) Filed: May 31, 2011

(65) Prior Publication Data
US 2011/0297977 A1    Dec. 8, 2011

(30) Foreign Application Priority Data

Jun. 3, 2010  (JP) ................ 2010-127867
Apr. 20, 2011  (JP) ................ 2011-093719

(51) Int. Cl.
*H01L 51/52* (2006.01)
*B05D 5/06* (2006.01)

(52) U.S. Cl. ............... 257/88; 257/13; 257/40; 257/89; 257/98; 257/E33.013; 257/E33.043; 257/E33.062; 257/E51.028; 313/506; 345/32; 345/89; 427/66; 438/34; 438/37; 438/39; 438/46

(58) Field of Classification Search .............. 257/13, 257/40, 88, 89, 98, E33.013, E33.043, E33.062, 257/E51.028; 313/506; 345/32, 89; 427/66; 438/34, 37, 39, 46

See application file for complete search history.

(56) References Cited

U.S. PATENT DOCUMENTS

| | | | | |
|---|---|---|---|---|
| 6,566,807 | B1 * | 5/2003 | Fujita et al. | 313/506 |
| 2005/0186330 | A1 * | 8/2005 | Kim et al. | 427/66 |
| 2006/0017377 | A1 * | 1/2006 | Ryu | 313/504 |
| 2007/0057264 | A1 * | 3/2007 | Matsuda | 257/88 |
| 2007/0075948 | A1 * | 4/2007 | Nagayama et al. | 345/89 |
| 2010/0133522 | A1 * | 6/2010 | Pieh et al. | 257/40 |

FOREIGN PATENT DOCUMENTS

JP  2004-119201 A  4/2004

* cited by examiner

*Primary Examiner* — Dao H Nguyen
(74) *Attorney, Agent, or Firm* — Canon U.S.A., Inc., IP Division

(57) ABSTRACT

A display device includes a first organic electroluminescent element and a second organic electroluminescent element. The first and second organic electroluminescent elements have different luminescent colors. The first and second organic electroluminescent elements each include, in series, a first electrode, a first charge transport layer, a second charge transport layer, a light-emitting layer, and a second electrode. The first charge transport layer is common to the first and second organic electroluminescent elements. The second charge transport layer of the first organic electroluminescent element is different in thickness from the second charge transport layer of the second organic electroluminescent element. The concentration of a dopant material contained in the first charge transport layer is less than that of the second charge transport layer.

12 Claims, 2 Drawing Sheets

DISPLAY DEVICE

BACKGROUND OF THE INVENTION

1. Field of the Invention

The present invention relates to a display device.

2. Description of the Related Art

Organic electroluminescent (EL) elements have been proposed for next-generation display devices and are currently under active development. The organic EL elements are electronic elements that emit light when holes and electrons injected from anodes and cathodes, respectively, are recombined with each other in light-emitting layers. Therefore, the ratio of the recombination current to the total current, that is, the carrier balance factor, is important in improving the emission efficiency of the organic EL elements. In order to increase the carrier balance factor, recombination processes in the light-emitting layers need to be optimized and the injection or transport process of charges from electrodes to the light-emitting layers need to be also optimized.

In organic EL arrays each outputting a plurality of luminescent colors, the mobility of charges moving from electrodes to light-emitting layers, that is, the necessary conductivity, usually depends on the luminescent colors. This is because material properties, such as bandgap and mobility, of the light-emitting layers and the optimum thickness of charge transport layers for an increase in extraction efficiency depends on the luminescent colors. Thus, when the charge transport layers are made of the same material, it is difficult to achieve high carrier balance for each luminescent color.

Co-deposited films made of a charge-transporting material doped with a donor or acceptor dopant are sometimes used as charge transport layers. The co-deposited films can be reduced in driving voltage because the bulk conductivity thereof and charge injection properties of junction interfaces are increased due to the charge transfer between the host (the charge-transporting material) and the dopant. The co-deposited films, which contain the dopant, have an advantage that the conductivity of the co-deposited films can be controlled by varying the concentration of the dopant. As disclosed in Japanese Patent Laid-Open No. 2004-119201, attempts have been made to solve the above problem in such a manner that the concentration of a dopant in each luminescent color is optimized.

In a display device disclosed in Japanese Patent Laid-Open No. 2004-119201, elements are isolated by a separator and therefore all layers including charge transport layers are patterned for each luminescent color. If deposition failure is caused by the misalignment of a deposition mask, a substrate electrode cannot be sufficiently covered with a low-conductivity layer such as a light-emitting layer and therefore an anode and a cathode are short-circuited. That is, a conventional technique for forming charge transport layers by patterning for each luminescent color causes an increased number of failed organic EL elements. This may lead to a significant reduction in productivity.

A technique for continuously providing a charge-transporting material on a substrate in the in-plane direction thereof is known to prevent short-circuiting due to deposition failure. In general, the charge-transporting material used in this technique may have low conductivity. This is because short-circuit currents generated at deposition failure sites can be prevented from flowing between an anode and a cathode and unintended electrical connections between working elements and elements adjacent thereto, that is, side-to-side crosstalk, can be effectively prevented. However, the use of a charge-transporting material with low conductivity causes a problem that it is difficult to achieve high carrier balance for each luminescent color. Since injection properties are lower as compared to a charge transport layer, there is a problem in that an increase in the thickness of the charge transport layer increases the driving voltage of a light-emitting element.

SUMMARY OF THE INVENTION

Aspects of the present invention provide a display device which has high emission efficiency for each luminescent color and low driving voltage and in which short-circuiting and side-to-side crosstalk are prevented.

A display device according to an embodiment of the present invention includes a first organic EL element and a second organic EL element emitting a color different from a color emitted by the first organic EL element. The first and second organic EL elements each include, in series, a first electrode, a first charge transport layer containing a charge-transporting material and a dopant material, a second charge transport layer containing a charge-transporting material and a dopant material, a light-emitting layer, and a second electrode. The first charge transport layer is common to the first and second organic EL elements and has a uniform thickness. The second charge transport layer of the first organic EL element is different in thickness from the second charge transport layer of the second organic EL element. The concentration of the dopant material in the first charge transport layer is less than the concentration of the dopant material in the second charge transport layer.

A display device according to another embodiment of the present invention includes a first organic EL element and a second organic EL element emitting a color different from a color emitted by the first organic EL element. The first and second organic EL elements each include, in series, a first electrode, a first charge transport layer containing a charge-transporting material and no dopant material, a second charge transport layer containing a charge-transporting material and a dopant material, a light-emitting layer, and a second electrode. The first charge transport layer is common to the first and second organic EL elements and has a uniform thickness. The second charge transport layer of the first organic EL element is different in thickness from the second charge transport layer of the second organic EL element.

According aspects of the present invention, the following device can be provided: a display device which has high emission efficiency for each luminescent color and low driving voltage and in which short-circuiting and side-to-side crosstalk are prevented.

Further features of the present invention will become apparent from the following description of exemplary embodiments with reference to the attached drawings.

DESCRIPTION OF THE EMBODIMENTS

A display device according to an embodiment of the present invention includes a substrate, a first organic EL element, and a second organic EL element, the first and second organic EL elements being disposed on the substrate. The luminescent color of the first organic EL element is different from the luminescent color of the second organic EL element.

The number of types of organic EL elements disposed on the substrate is not limited to two. The following element may be disposed on the substrate: another organic EL element, such as a third organic EL element or a fourth organic EL element, having a luminescent color different from the luminescent color of the first or second organic EL element.

In this embodiment, the first and second organic EL elements each include, in series, a first electrode, a first charge transport layer, a second charge transport layer, a light-emitting layer, and a second electrode. The first charge transport layer is common to the first and second organic EL elements and contains a charge-transporting material and a dopant. The second charge transport layer of the first organic EL element is different in thickness from that of the second organic EL element. The second charge transport layers, as well as the first charge transport layer, contain a charge-transporting material and a dopant.

In this embodiment, the concentration of the dopant in the first charge transport layer is less than the concentration of the dopant in the second charge transport layer.

The display device is described below in detail with reference to the attached drawings.

Figure 1:
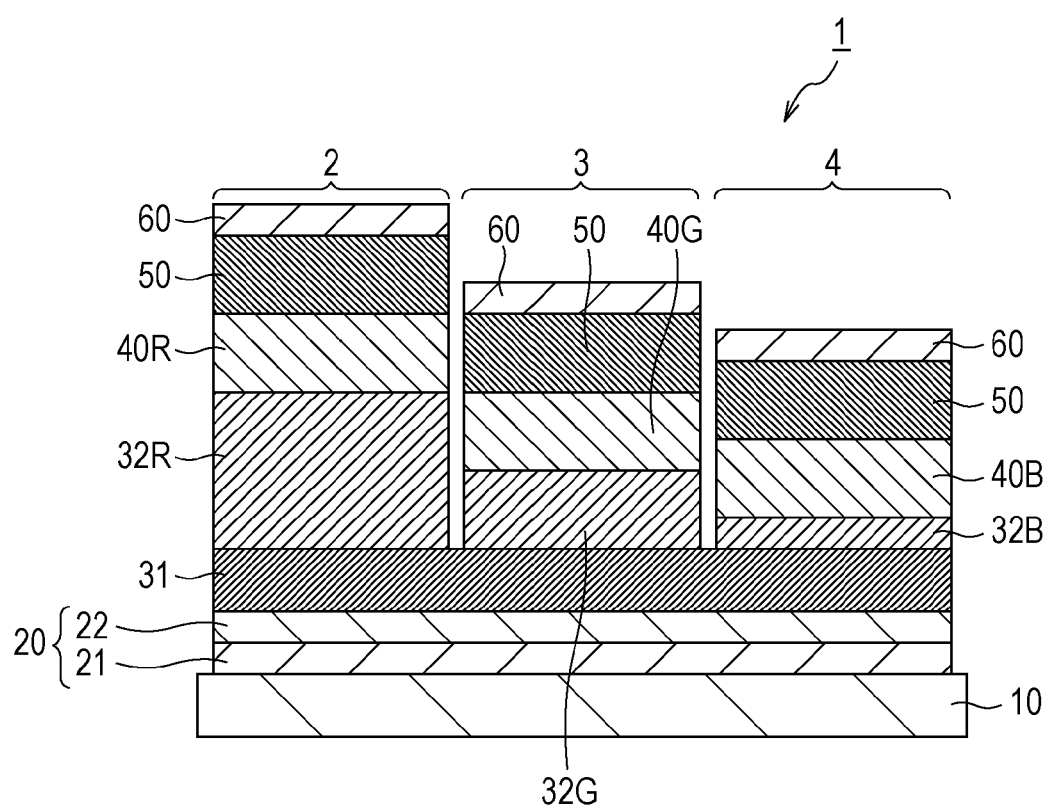
FIG. 1 is a schematic sectional view of a display device according to an embodiment of the present invention.
Figure 2:
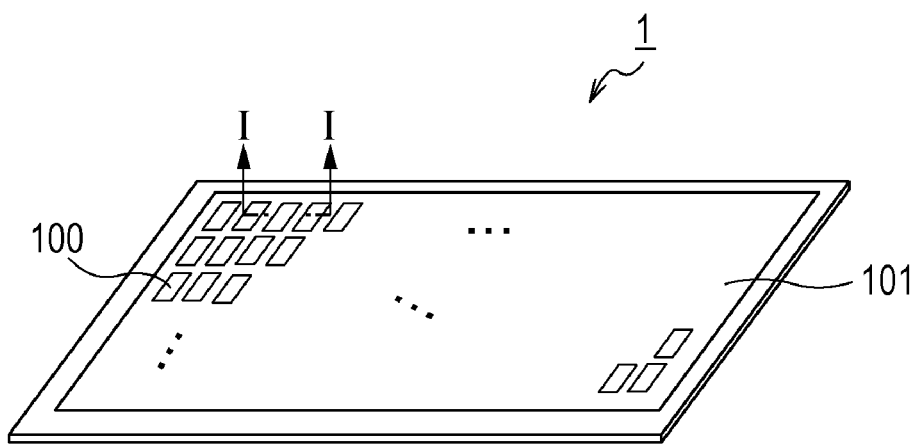
FIG. 2 is a schematic plan view of the display device shown in FIG. 1.

FIG. 1 is a schematic sectional view of the display device. FIG. 2 is a schematic plan view of the display device. With reference to FIG. 2, the display device includes a display region 101 including pixels 100 arranged in a matrix pattern. The pixels 100 each include an organic EL element serving as a light-emitting element. A sectional view taken along the line I-I of FIG. 2 corresponds to FIG. 1.

With reference to FIG. 1, the display device 1 includes a substrate 10 and three types of organic EL elements: a first organic EL element (R organic EL element) 2, a second organic EL element (G organic EL element) 3, and a third organic EL element (B organic EL element) 4. The first to third organic EL elements 2 to 4 are arranged on the substrate 10.

The first to third organic EL elements 2 to 4 each include the following electrodes and layers arranged on the substrate 10 in this order:
  (a) a first electrode 20 including a reflective sub-electrode 21 and a transparent sub-electrode 22,
  (b) a first charge transport layer 31,
  (c) a second charge transport layer 32 (32R, 32G, or 32B),
  (d) a light-emitting layer 40 (40R, 40G, 40B),
  (e) a third charge transport layer 50, and
  (f) a second electrode 60.

The display device 1 is not limited to the above configuration. The display device 1 may further include, for example, another charge transport layer disposed between the light-emitting layer 40 and the second charge transport layer 32 or the third charge transport layer 50 or between the third charge transport layer 50 and the second electrode 60.

In the display device 1, the first, second, and third charge transport layers 31, 32, and 50 each serve as a hole or electron transport layer depending on the property of the first and second electrodes 20 and 60. That is, when the first electrode 20 is an anode and the second electrode 60 is a cathode, the first and second charge transport layers 31 and 32 serve as hole transport layers and the third charge transport layer 50 serves as an electron transport layer. When the first electrode 20 is a cathode and the second electrode 60 is an anode, the first and second charge transport layers 31 and 32 serve as electron transport layers and the third charge transport layer 50 serves as a hole transport layer.

Layers and members making up the display device 1 are described below with reference to FIG. 1.

Examples of the substrate 10, which is used in the display device 1, include various glass substrates such as glass substrates having driving circuits including thin-film transistors (TFTs) made of a semiconductor such as poly-silicon (p-Si) or amorphous silicon (a-Si), glass substrates having driving circuits formed on silicon wafers, and silicon wafers having driving circuits thereon.

The reflective sub-electrode 21, which is included in the first electrode 20, may be made of a highly reflective material. In the case of using the first electrode 20 as an anode, examples of a material making up the reflective sub-electrode 21 include metal materials such as gold, platinum, silver, aluminum, and magnesium and alloys of the metal materials. The transparent sub-electrode 22 is disposed on the reflective sub-electrode 21 and may be made of a transparent conductive material such as indium tin oxide or indium zinc oxide in view of hole injection. In the case of using the first electrode 20 as a cathode, the metal materials and the alloys can be used to form the reflective sub-electrode 21 depending on the work function of the metal materials and the alloys. In this case, the transparent sub-electrode 22 may be disposed on the reflective sub-electrode 21. In the case of using the first electrode 20 as a cathode, the transparent conductive material, such as indium tin oxide or indium zinc oxide, may be used to form the transparent sub-electrode 22.

The first charge transport layer 31, which is disposed on the first electrode 20, continuously extends in the in-plane direction of the substrate 10. That is, the first charge transport layer 31 is common to the first to third organic EL elements 2 to 4. The first electrode 20 can be sufficiently covered with the first charge transport layer 31 and therefore short-circuits due to deposition failure can be prevented from occurring between the first and second electrodes 20 and 60.

The first charge transport layer 31 contains the charge-transporting material and the dopant as described above. The concentration of the dopant in the first charge transport layer 31 may be determined such that the concentration of the dopant in the first charge transport layer 31 is less than that of the second charge transport layer 32 (32R, 32G, or 32B) and the first charge transport layer 31 has high charge injection properties and appropriate bulk resistance. In particular, the concentration of the dopant in the first charge transport layer 31 is 1% by weight or less such as 0.5% by weight or less. This allows the display device 1 to have low driving voltage and also allows the resistance between the first and second electrodes 20 and 60 to be ensured at deposition failure sites; hence, short-circuits can be prevented from occurring between the first and second electrodes 20 and 60. Furthermore, a side-to-side crosstalk phenomenon in which a working organic EL element is electrically connected to an element adjacent thereto can be effectively prevented. The bulk resistivity sufficient to prevent side-to-side crosstalk is $2.5 \times 10^4$ Ωcm or less under, for example, the following conditions:
  (i) a first charge transport layer 31 thickness of 100 nm,
  (ii) a pixel size of 100 μm×100 μm,
  (iii) an inter-pixel distance of 10 μm, and
  (iv) a contrast ratio of 500:1.

The optimum bulk resistivity of the first charge transport layer 31 depends on the design and properties, such as layer thickness, I-V characteristics, and inter-pixel distance, of the display device 1 and therefore may be determined depending on the display device 1.

The second charge transport layers 32 (32R, 32G, and 32B) are separately arranged in the first, second, and third organic EL elements 2, 3, and 4 and have different thicknesses depending on the luminescent colors of the first, second, and third organic EL elements 2, 3, and 4. A method of determining the thickness of each second charge transport layer 32 is described below.

The second charge transport layer 32, as well as the first charge transport layer 31, contains the charge-transporting material and the dopant. The concentration of the dopant in the second charge transport layer 32 may be determined such that the efficiency and driving voltage of each of the first to third organic EL elements 2 to 4 are optimized. In particular, the concentration of the dopant in the second charge transport layer 32 may be 3% to 7% by weight. When the second charge transport layer 32 has an increased thickness, the dopant concentration thereof may be set to a high value such that high conductivity is obtained for the purpose of preventing an increase in driving voltage. This ensures both high emission efficiency and low driving voltage. Thus, the dopant concentration of the second charge transport layer 32 may increase with an increase in the thickness of the second charge transport layer 32.

In order to prevent an increase in driving voltage due to the interfacial energy barrier between different materials, the first charge transport layer 31 and the second charge transport layer 32 may be made of the same charge-transporting material (host). This allows the conductivity of the first and second charge transport layers 31 and 32 to be controlled only with the dopant concentration, leading to the ease of device design.

The charge-transporting material contained in the first charge transport layer 31 may be different from the charge-transporting material contained in the second charge transport layer 32 unless an increase in voltage occurs at the interface between the first charge transport layer 31 and the second charge transport layer 32. In this case, a material having a good capability to transport charges to the first electrode 20 can be selected for the first charge transport layer 31 and a material having a good capability to inject charges to the light-emitting layer 40 can be selected for the second charge transport layer 32. This allows an increase in emission efficiency and a reduction in driving voltage.

In the display device 1, when the first electrode 20 is an anode, the first charge transport layer 31 is a first hole transport layer and the second charge transport layer 32 is a second hole transport layer. In this case, a charge-transporting material contained in each of the first and second hole transport layers is a hole-transporting material. A dopant contained in each of the first and second hole transport layers is an acceptor dopant (p-type dopant).

Examples of the p-type dopant include high-electron affinity materials such as a cyano-organic compound disclosed in Japanese Patent No. 3571977 and inorganic compounds including vanadium oxide, molybdenum oxide, and tungsten oxide. The hole-transporting material may be a known one.

In the display device 1, when the first electrode 20 is a cathode, the first charge transport layer 31 is a first electron transport layer and the second charge transport layer 32 is a second electron transport layer. In this case, a charge-transporting material contained in each of the first and second electron transport layers is an electron-transporting material. A dopant contained in each of the first and second electron transport layers is a donor dopant (electron-donating dopant).

Examples of the electron-transporting material include known electron-transporting organic materials such as aluminum quinolinol complexes and phenanthroline compounds.

In order to increase the electron injection efficiency of the first and second electron transport layers, a low-work function metal or a compound thereof may be used as the donor dopant (electron-donating dopant). Examples of the low-work function metal include alkali metals, alkaline-earth metals, and rare-earth metals. In particular, alkali metal compounds may be provided because the alkali metal compounds are relatively readily handled in air. Among the alkali metal compounds, cesium compounds may be provided. In particular, cesium carbonate is stable in air and therefore is readily handled.

In the display device 1, the thickness of each of the first charge transport layer 31 and the second charge transport layers 32 (32R, 32G, and 32B) is appropriately adjusted in order to increase the light extraction efficiency of the first to third organic EL elements 2 to 4.

The interference between light emitted from the light-emitting layer 40 and light reflected by the reflective sub-electrode 21 is maximum when the following equation is satisfied:

$$d = (2m-1) \times \frac{\lambda}{4n} \qquad (1)$$

wherein $\lambda$ is the wavelength of the maximum peak in the spectrum of light emitted from the organic EL element, d is the distance from the emission position of the light-emitting layer 40 to the reflective sub-electrode 21, n is the refractive index of an organic compound layer, and m is a natural number. In this embodiment, the term "the refractive index of an organic compound layer" refers to the average of the refractive index of the first charge transport layer 31, that of each second charge transport layer 32, and that of the light-emitting layer 40 as required.

When the optical path from the emission position of each of the first to third organic EL elements 2 to 4 to the reflective sub-electrode 21 is an odd multiple of one-fourth of the wavelength of the maximum peak in the spectrum obtained from each of the first to third organic EL elements 2 to 4, the extraction efficiency of light is maximum.

In consideration of the effect of the phase shift of an electrode surface of an actual display device and the viewing angle that is in a trade-off with the light extraction efficiency of the front surface, the distance need not necessarily satisfy Equation (1). In particular, nd may deviate from a value satisfying Equation (1) within $\pm\lambda/8$. That is, d may satisfy the following inequality:

$$\left(2m - \frac{3}{2}\right) \times \frac{\lambda}{4n} \leq d \leq \left(2m - \frac{1}{2}\right) \times \frac{\lambda}{4n} \qquad [A]$$

wherein m is preferably 2.

In the display device 1, the first to third organic EL elements 2 to 4 have the same order of interference. According to aspects of the present invention, a combination of the orders of interference m of red, green, and blue organic EL elements making up an organic EL array is arbitrary.

The thickness of the second charge transport layer 32 (32R, 32G, or 32B) is given by the following equation using d determined from Equation (1) on the assumption that organic compound layers have the same refractive index:

(the thickness of the second charge transport layer 32)=d−((the thickness of the transparent sub-electrode 22)+(the thickness of the first charge transport layer 31)+(the distance from the emission position to the interface between the light-emitting layer 40 and the second charge transport layer 32)).

When, in display devices, one of organic EL elements that includes a second charge transport layer having the least thickness has a low dopant concentration and high emission efficiency, the thickness of the second charge transport layer may be zero. In the case of taking the display device 1 as an example, this corresponds to that the thickness of the second charge transport layer 32B of the third organic EL element (B organic EL element) 4 is zero. This ensures both the prevention of short-circuiting and high emission efficiency and also allows the number of times a deposition mask is aligned to be reduced, thereby enabling a deposition process to be simplified.

The light-emitting layer 40 and the third charge transport layer 50 are made of known materials, that is, a luminescent material and a charge-transporting material, respectively. A hole- or electron-blocking layer may be placed next to the light-emitting layer 40.

The second electrode 60 is translucent. In the case of using the second electrode 60 as a cathode, an example of the second electrode 60 is a thin-film electrode which is made of a metal material and which is sufficiently thin to transmit light. Examples of the metal material include gold, platinum, silver, aluminum, chromium, magnesium, and alloys of these metals. In the case of using the second electrode 60 as an anode, the second electrode 60 may be made of the metal material or an alloy thereof depending on the work function of the metal material. The second electrode 60, which is translucent, may have sufficient reflectivity and low light absorbance. Therefore, the thickness of the second electrode 60 may be 1 nm to 30 nm.

The display device 1 may be sealed for the purpose of preventing the display device 1 from being deteriorated by moisture or oxygen in air. The display device 1 can be sealed by a known method.

Modification

When the charge-transporting material contained in the first charge transport layer 31 has a good capability to transport charges to the first electrode 20, the concentration of the dopant in the first charge transport layer 31 may be 0% by weight because the charge-transporting material alone is sufficient to form a charge transport layer. When the dopant concentration of the first charge transport layer 31 is 0% by weight, the first charge transport layer 31 may have a small thickness sufficient to prevent short-circuiting. This increases the degree of freedom in the dopant concentration of the second charge transport layer 32 depending on the luminescent color and readily ensures both high emission efficiency and low driving voltage.

EXAMPLE

Aspects of the present invention are further described below with reference to an example. The present invention is not limited to the example.

A display device shown in FIG. 1 was prepared by a procedure below.

A layer of an aluminum alloy (Al—Nd) was deposited on a glass substrate (substrate 10) by a sputtering process, whereby a reflective sub-electrode (reflective sub-anode) 21 was formed. The reflective sub-electrode 21 had a thickness of 100 nm. A layer of ITO was deposited on the reflective sub-electrode 21 by a sputtering process, whereby a transparent sub-electrode (transparent sub-anode) 22 was formed. The transparent sub-electrode 22 had a thickness of 38 nm. The reflective sub-electrode 21 and the transparent sub-electrode 22 collectively functioned as a first electrode (anode) 20. A polyimide film was formed on the substrate 10 having the first electrode 20 and was then patterned, whereby a pixel separator (not shown) was formed. The pixel separator had a height of 1 μm and a taper angle of 40 degrees. The substrate 10 having the first electrode 20 and the pixel separator was ultrasonically cleaned with acetone and isopropyl alcohol (IPA) in that order, was boiled in IPA, and was then dried. The substrate 10 was surface-cleaned with UV light and ozone.

An organic amine compound (host) represented by Compound 1 below and a cyano-organic compound (acceptor dopant) represented by Compound 2 below were co-deposited at a weight ratio of 99:1, whereby a first charge transport layer (first hole transport layer) 31 was formed. In this step, the first charge transport layer 31 was formed so as to be common to red, green, and blue organic EL elements. The thickness of the first charge transport layer 31 was 80 nm. During vapor deposition, the degree of vacuum was $1 \times 10^{-4}$ Pa and the rate of deposition was 0.01 nm/s to 0.3 nm/s.

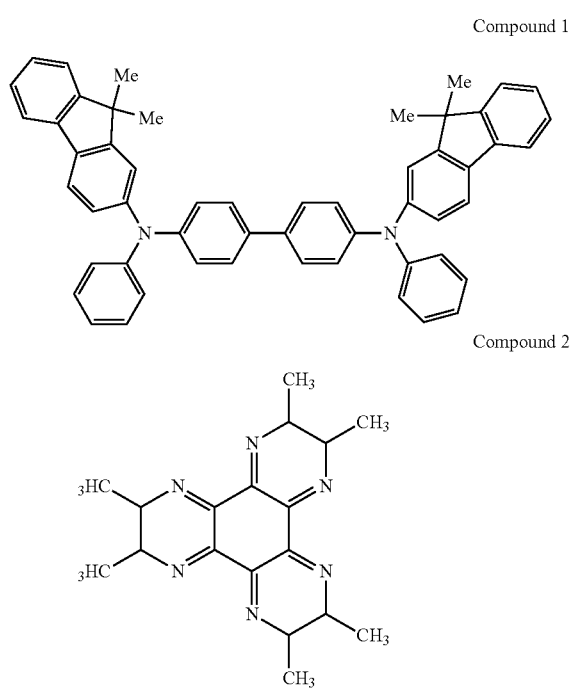

Compound 1

Compound 2

Although no second charge transport layer (second hole transport layer) was formed for the blue organic EL element, a second charge transport layer 32R was formed for the red organic EL element and a second charge transport layer 32G was formed for the green organic EL element. In particular, the second charge transport layers 32R and 32G were each formed using a shadow mask. In order to form the second charge transport layers 32R, an organic amine compound (Compound 1, that is, a host) and a cyano-organic compound (Compound 2, that is, a dopant) were co-deposited at a weight ratio of 95:5. The thickness of the second charge transport layer 32R was 95 nm. During vapor deposition, the degree of vacuum was $1 \times 10^{-4}$ Pa and the rate of deposition was 0.01 nm/s to 0.3 nm/s. In order to form the second charge transport layers 32G, an organic amine compound (Compound 1, that is, a host) and a cyano-organic compound (Compound 2, that is, a dopant) were co-deposited at a weight ratio of 97:3. The thickness of the second charge transport layer 32G was 35 nm. During vapor deposition, the degree of vacuum was $1 \times 10^{-4}$ Pa and the rate of deposition was 0.01 nm/s to 0.3 nm/s.

A light-emitting layer making up each of the red, green, and blue organic EL elements was formed. Materials used, the weight ratio of the materials, and the thickness of the light-emitting layer were summarized in Table 1.

TABLE 1

| | Host | Guest (Luminescent material) | Weight ratio (host to guest) | Thickness (nm) |
|---|---|---|---|---|
| Red light-emitting layer | $Alq_3$ | $Ir(piq)_3$ | 99:1 | 20 |
| Green light-emitting layer | $Alq_3$ | Coumarin 6 | 99:1 | 20 |
| Blue light-emitting layer | Balq | Perylene | 90:10 | 20 |

The degree of vacuum during vapor deposition: $1\times10^{-4}$ Pa
The rate of deposition: 0.01 nm/s to 0.1 nm/s Third charge transport layers (electron injection layers) 50 were formed in such a manner that a phenanthroline compound represented by Compound 3 below and cesium carbonate were co-deposited such that the concentration of cesium in each third charge transport layer 50 was 8.3% by weight. The thickness of the third charge transport layer 50 was 20 nm. During vapor deposition, the degree of vacuum was $1\times10^{-4}$ Pa and the rate of deposition was 0.01 nm/s to 0.3 nm/s.

Compound 3

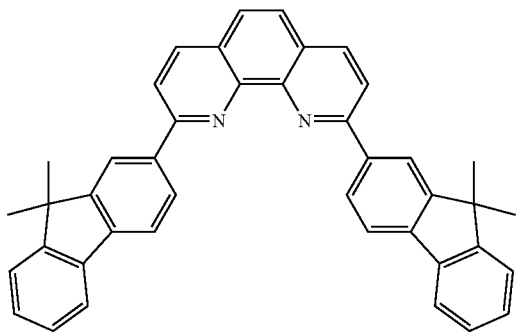

Layers of silver (Ag) were deposited on the third charge transport layers 50 by a thermal vapor deposition process, whereby second electrodes (translucent cathodes) 60 were formed. The second electrodes 60 had a thickness of 12 nm.

Finally, the substrate 10 having the above members was placed into a glove box with a nitrogen atmosphere and was then sealed with a glass cap containing a desiccant. The display device was prepared as described above.

A display device according to aspects of the present invention can be used as a member for monitors for televisions, personal digital assistants, mobile phones, digital cameras, digital video cameras, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-127867 filed Jun. 3, 2010 and No. 2011-093719 filed Apr. 20, 2011, which are hereby incorporated by reference herein in their entirety.

What is claimed is:

1. A display device comprising:
a first organic electroluminescent element; and
a second organic electroluminescent element emitting a color different from a color emitted by the first organic electroluminescent element,
wherein the first and second organic electroluminescent elements each include, in order, a first electrode, a first charge transport layer containing a charge-transporting material and a dopant material, a second charge transport layer containing a charge-transporting material and a dopant material, a light-emitting layer, and a second electrode;
the first charge transport layer is common to the first and second organic electroluminescent elements and has a uniform thickness;
the second charge transport layer of the first organic electroluminescent element is different in thickness from the second charge transport layer of the second organic electroluminescent element; and
the concentration of the dopant material in the first charge transport layer is less than the concentration of the dopant material in the second charge transport layer.

2. The display device according to claim 1, wherein the concentration of the dopant material in the second charge transport layer increases with an increase in the thickness of the second charge transport layer.

3. The display device according to claim 1, wherein the charge-transporting material contained in the first charge transport layer is the same as the charge-transporting material contained in the second charge transport layer.

4. The display device according to claim 1, wherein each of the first and second organic electroluminescent elements satisfies the following inequality:

$$\left(2m - \frac{3}{2}\right) \times \frac{\lambda}{4n} \leq d \leq \left(2m - \frac{1}{2}\right) \times \frac{\lambda}{4n} \quad [A]$$

where m represents a natural number, n represents the average of the refractive indices of the first and second charge transport layers, d represents the distance from the emission position of the light-emitting layer to a reflective sub-electrode, and λ represents the wavelength of the maximum peak in the spectrum of light emitted from each of the first and second organic electroluminescent elements.

5. The display device according to claim 1, wherein the first electrode is an anode, the second electrode is a cathode, the first charge transport layer is a first hole transport layer, the second charge transport layer is a second hole transport layer, the dopant material is an acceptor dopant material, and the charge-transporting material in the first charge transport layer and the charge-transporting material in the second charge transport layer both are a hole-transporting material.

6. The display device according to claim 1, wherein the first electrode is a cathode, the second electrode is an anode, the first charge transport layer is a first electron transport layer, the second charge transport layer is a second electron transport layer, the dopant material is an donor dopant material, and the charge-transporting material in the first charge transport layer and the charge-transporting material in the second charge transport layer both are an electron-transporting material.

7. A display device comprising:

a first organic electroluminescent element; and a second organic electroluminescent element emitting a color different from a color emitted by the first organic electroluminescent element, wherein the first and second organic electroluminescent elements each include, in order, a first electrode, a first charge transport layer containing a charge-transporting material and no dopant material, a second charge transport layer containing a charge-transporting material and a dopant material, a light-emitting layer, and a second electrode; the first charge transport layer is common to the first and second organic electroluminescent elements and has a uniform thickness; and the second charge transport layer of the first organic electroluminescent element is different in thickness from the second charge transport layer of the second organic electroluminescent element.

8. The display device according to claim 7, wherein the concentration of the dopant material in the second charge transport layer increases with an increase in the thickness of the second charge transport layer.

9. The display device according to claim 7, wherein the charge-transporting material contained in the first charge transport layer is the same as the charge-transporting material contained in the second charge transport layer.

10. The display device according to claim 7, wherein each of the first and second organic electroluminescent elements satisfies the following inequality:

$$\left(2m - \frac{3}{2}\right) \times \frac{\lambda}{4n} \le d \le \left(2m - \frac{1}{2}\right) \times \frac{\lambda}{4n} \quad [A]$$

where m represents a natural number, n represents the average of the refractive indices of the first and second charge transport layers, d represents the distance from the emission position of the light-emitting layer to a reflective sub-electrode, and λ represents the wavelength of the maximum peak in the spectrum of light emitted from each of the first and second organic electroluminescent elements.

11. The display device according to claim 7, wherein the first electrode is an anode, the second electrode is a cathode, the first charge transport layer is a first hole transport layer, the second charge transport layer is a second hole transport layer, the dopant material is an acceptor dopant material, and the charge-transporting material in the first charge transport layer and the charge-transporting material in the second charge transport layer both are a hole-transporting material.

12. The display device according to claim 7, wherein the first electrode is a cathode, the second electrode is an anode, the first charge transport layer is a first electron transport layer, the second charge transport layer is a second electron transport layer, the dopant material is an donor dopant material, and the charge-transporting material in the first charge transport layer and the charge-transporting material in the second charge transport layer both are an electron-transporting material.

* * * * *